United States Patent
Hong et al.

(10) Patent No.: US 8,198,105 B2
(45) Date of Patent: Jun. 12, 2012

(54) MONITOR FOR VARIATION OF CRITICAL DIMENSIONS (CDS) OF RETICLES

(75) Inventors: Hyesook Hong, Richardson, TX (US); Zhiliu Ma, Plano, TX (US); John K. Wright, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 9 days.

(21) Appl. No.: 10/630,332

(22) Filed: Jul. 30, 2003

(65) Prior Publication Data

US 2005/0164096 A1    Jul. 28, 2005

(51) Int. Cl.
*H01L 21/66* (2006.01)
*G01N 21/00* (2006.01)
*G03F 1/00* (2012.01)
*G21K 5/10* (2006.01)

(52) U.S. Cl. ....... 438/14; 356/237.5; 430/5; 250/492.22

(58) Field of Classification Search .................... 438/14; 356/237.5; 430/5; 250/492.22; 358/237.5
See application file for complete search history.

(56) References Cited

U.S. PATENT DOCUMENTS

| | | | | |
|---|---|---|---|---|
| 4,357,540 A * | 11/1982 | Benjamin et al. | ........... | 250/491.1 |
| 5,646,870 A * | 7/1997 | Krivokapic et al. | ............. | 716/4 |
| 5,914,784 A * | 6/1999 | Ausschnitt et al. | ........... | 356/624 |
| 6,130,016 A * | 10/2000 | Kent | ............................. | 430/30 |
| 6,275,971 B1 | 8/2001 | Levy et al. | | |
| 6,522,776 B1 * | 2/2003 | Ehrichs | ........................ | 382/144 |
| 6,741,334 B2 * | 5/2004 | Asano et al. | ..................... | 355/77 |
| 7,304,791 B2 * | 12/2007 | Minobe et al. | ................ | 359/385 |

* cited by examiner

*Primary Examiner* — Charles Garber
*Assistant Examiner* — Ron Pompey
(74) *Attorney, Agent, or Firm* — Jacqueline J. Garner; Wade J. Brady, III; Frederick J. Telecky, Jr.

(57) ABSTRACT

The present invention provides a reticle 100 for use in a lithographic process. The reticle, in one embodiment, includes a patterned layer 110 located over a reticle substrate. The reticle 100 may further include a test pattern 130 located over the reticle substrate, wherein a portion of the test pattern 130 is within a step-distance of a portion of the patterned layer. In this embodiment, a variance in the test pattern is indicative of a variance in the patterned layer.

12 Claims, 3 Drawing Sheets

MONITOR FOR VARIATION OF CRITICAL DIMENSIONS (CDS) OF RETICLES

TECHNICAL FIELD OF THE INVENTION

The present invention is directed, in general, to a method for manufacturing a semiconductor device and, more specifically, to a method for monitoring critical dimension (CD) variations of a reticle.

BACKGROUND OF THE INVENTION

Current demands for high density and performance associated with ultra large scale integration require submicron features, increased transistor and circuit speeds, and improved reliability. Such demands require formation of device features with high precision and uniformity, which in turn necessitates careful process monitoring, including frequent and detailed inspections of the devices while they are still in the form of semiconductor wafers.

One important process requiring careful inspection is photolithography, wherein masks are used to transfer circuitry patterns to semiconductor wafers. Typically, a series of such masks are employed in a preset sequence. Each photolithographic mask includes an intricate set of geometric patterns corresponding to the circuit components to be integrated onto the wafer. Each mask in the series is used to transfer its corresponding pattern onto a photosensitive layer (i.e., a photoresist layer), which has been previously coated on a layer, such as a polysilicon or metal layer formed on the silicon wafer. The transfer of the mask pattern onto the photoresist layer is conventionally performed by an optical exposure tool such as a scanner or a stepper, which directs light or other radiation through the mask to expose the photoresist. The photoresist is thereafter developed to form a photoresist mask, and the underlying polysilicon or metal layer is selectively etched in accordance with the mask to form features such as lines or gates.

Fabrication of the mask follows a set of predetermined design rules set by processing and design limitations. These design rules define the space tolerance between devices and interconnecting lines and the width of the lines themselves, to ensure that the devices or lines do not overlap or interact with one another in undesirable ways. The design rule limitation is referred to as the critical dimension ("CD", defined as the critical width of a line or the critical smallest space between two lines. The CD for most ultra large scale integration applications is on the order of a fraction of a micron.

As design rules shrink and process windows (i.e., the margins for error in processing) become smaller, inspection and measurement of surface features' CD, as well as their cross-sectional shape ("profile") are becoming increasingly important. Deviations of a feature's CD and profile from design dimensions may adversely affect the performance of the finished semiconductor device.

One problem currently experienced in the art is that of systematic variation of CD in the reticles used to pattern the aforementioned photoresist mask, and resulting device feature. As those skilled in the art are well aware, any systematic variation of CD, normally less than about 40 nm in range, in the reticles will ultimately be projected to the final semiconductor features through the photoresist mask. Accordingly, reticle imperfections, such as systematic variation of CD in the reticle, can be costly to the manufacturing process.

It is believed that the systematic variation of CD in the reticles is caused by the inability of the device patterning the reticle (e.g., a reticle writing tool, such as vector-scan, shaped e-beam tools, JBX series of Jeol, EBM series of Toshiba, and HL series of Hitachi) to accurately calibrate itself after a required shift in the stage holding the reticle during patterning. Generally, the device patterning the reticle can only pattern a portion of the reticle before the stage must shift to continue patterning. During this shift, however, if the device is not re-calibrated accurately, a systematic shift in CD is created for the portion of the reticle formed after the shift. If not corrected, at least two different CD measurements may exist for the same feature. Unfortunately, by nature of the photolithographic process, these CD variations are transferred to the wafer. Even more unfortunate is the fact that no current reticle or mask inspection tools are capable of detecting such small CD errors in the reticle or mask.

Accordingly, what is needed in the art is a simple, cost-effective method or device that allows these systematic variation of CD in the reticles to be detected or corrected.

SUMMARY OF THE INVENTION

To address the above-discussed deficiencies of the prior art, the present invention provides a reticle for use in a lithographic process. The reticle, in one embodiment, includes a patterned layer located over a reticle substrate. The reticle may further include a test pattern located over the reticle substrate, wherein a portion of the test pattern is within a step-distance of a portion of the patterned layer. In this embodiment, a variance in the test pattern is indicative of a variance in the patterned layer.

The present invention further provides a method for monitoring critical dimension (CD) variations of a reticle. Among other things, the method includes providing the aforementioned reticle, patterning a material using the reticle, and then visually inspecting the material for light and dark regions. In this embodiment, the light and dark regions represent the variance in the patterned layer.

In another embodiment, a method for making a semiconductor device using the aforementioned reticle is provided. The method may include, among other steps: 1) patterning a resist material using the aforementioned reticle, and 2) using the patterned resist material to form a feature of a semiconductor device.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
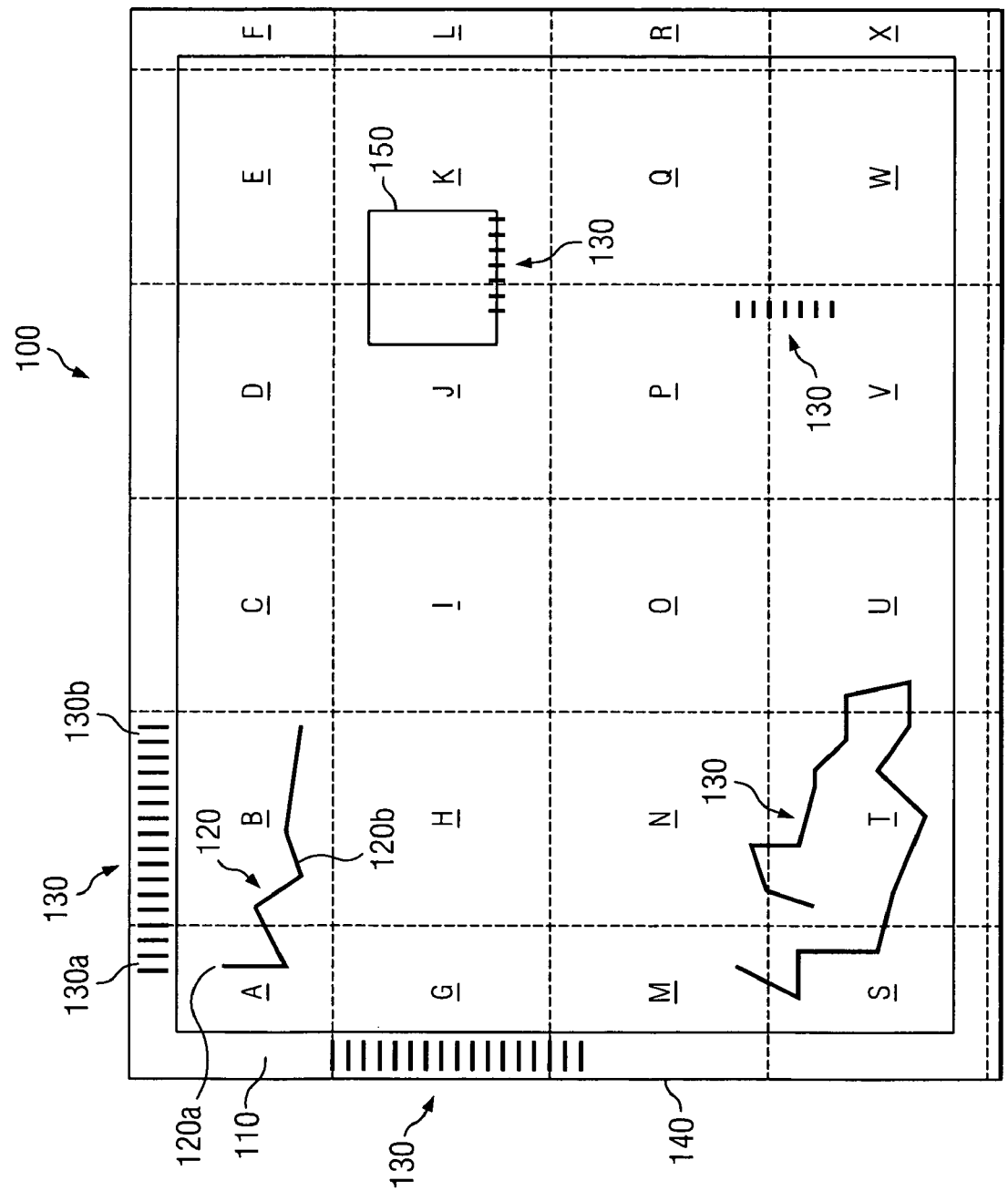
FIG. 1 illustrates a reticle for use in a lithographic process, which has been constructed in accordance with the principles of the present invention.

Turning initially to FIG. 1, illustrated is a reticle 100 for use in a lithographic process, which has been constructed in accordance with the principles of the present invention. The reticle 100 illustrated in FIG. 1 includes a patterned layer 110 located over a reticle substrate. The patterned layer 110, in one embodiment, comprises what is left of a blanket deposited reflective layer, energy absorbent layer, or another similar layer, after patterning thereof. In the particular embodiment shown, the dark colored lines represent regions where the aforementioned reflective layer, energy absorbent layer, or other similar layer, has been removed. For purposes of describing the present invention, a limited number of dark colored lines have been illustrated. It should be noted, however, that it is quite common for the patterned layer to be covered with dark colored lines, each representing a region where the layer has been removed.

Those skilled in the art understand how to form the patterned layer 110. For instance, in one embodiment particularly germane to the present invention, the patterned layer 110 has been formed using a shaped e-beam mask writer. One known mask writer that might be used is a 50 keV JEOL JBX 9000, which might be obtained from JEOL USA, Inc., at 11 Dearborn Rd., Peabody, Mass. 01960.

Common to many mask writing devices, and particularly e-beam mask writing devices, is the requirement that the stage holding the reticle substrate step to accommodate the large surface area of the reticle 100 during writing. Accordingly, shown in FIG. 1 are various step-areas A-X, each having a step-distance, which represent the area the mask writing device may pattern without the stage having to shift. The step-distance is quite dependent on the type of mask writing device used, and therefore has a wide range of values. For instance, the aforementioned JBX 9000 has a step-distance of about 500 µm, in both the x and y directions.

Because of the shift in the stage, individual patterns, such as individual pattern 120, may be formed in two different step-areas A and B. In this example, the individual pattern 120 is therefore divided into a first patterned portion 120a and a second patterned portion 120b, located in step-areas A and B, respectively.

As detailed in the background of the invention section, forming an individual pattern in two different step-areas encounters certain issues. One issue is the ability/inability of the mask writing device to accurately re-calibrate itself to the new step-area. If the mask writing device is unable to accurately re-calibrate itself, which is often the case, then a variance in the individual pattern 120 may result. The variance, which may arise in the form of a shift in critical dimension (CD) values between the first patterned portion 120a and second patterned portion 120b, may be particularly problematic to the operation of the circuit upon which the individual pattern 120 is ultimately located. Often this CD is systematic.

As indicated above, often this variance goes undetected. Unfortunately, if the variance in the patterned layer 110 goes undetected, this faulty reticle 100 might be used to manufacture a plurality of integrated circuits, each integrated circuit having sub-par operating characteristics due to the variance.

Accordingly, and in accordance with the principles the present invention, a test pattern 130 is formed over the reticle substrate. Of importance is the fact that at least a portion of the test pattern 130 is located within a step-distance of a portion of the patterned layer. For instance, in the embodiment of FIG. 1, the test pattern 130 may be separated into two portions, a first test pattern portion 130a located within step-area A and a second test pattern portion 130b located within step-area B. Accordingly, the first test pattern portion 130a is within a step distance of first patterned portion 120a, and a second test pattern portion 130b is within a step-distance of second patterned portion 120b.

As described in more detail in later FIGUREs, the test pattern 130, and particularly the first and second test pattern portions 130a, 130b, may be used to observe a variance in the patterned layer 110. Particularly, the first and second test pattern portions 130a, 130b, can be used to observe a variance in the test pattern 130, which as a result of being formed in the same step-distance, and thus step-area, have the same characteristics as the individual pattern 120. Accordingly, the variance in the test pattern 130 can be correlated to a variance in the individual pattern 120.

As indicated in FIG. 1, any number of test patterns may be located over the reticle substrate. Actually, the greater the number of test patterns that are used, the more accurate the variance measurement for the entire reticle is. In one embodiment, the test pattern 130 (or test patterns) may be located just inside the pellicle frame 140 of the reticle 100. In a similar embodiment not shown, the test pattern 130 could line the entire reticle 100, just inside the pellicle frame 140. Alternatively, as shown, the test pattern 130 may be located horizontally or vertically.

It is important, however, that the test pattern not generally be located in an area where a patterned feature might be located. For instance, in most known circumstances it would not be advisable to have the test pattern 130 be interposed upon the individual pattern 120, or any other pattern for that matter. It is believed that such a feature, when transferred to the semiconductor wafer, could cause a short or other undesirable issue.

Accordingly, it is common for the test pattern 130 to be located within a scribe region 150 defined by the patterned layer 110. While the scribe region 150 is not typically shown on the reticle 100, those skilled in the art generally know where these scribe regions are located during the design phase of the reticle. If placed within the scribe region 150 as just mentioned, test patterns may be located within the interior of the reticle 100, without affecting the integrity of the process and/or resulting semiconductor features. The test patterns, similar to above, may be located either horizontally or vertically along the scribe region 150.

Figure 2:
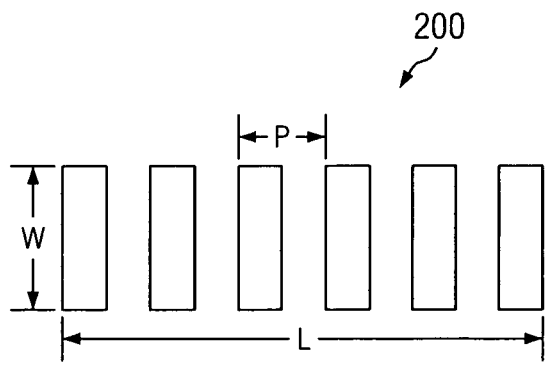
FIG. 2 illustrates one exemplary embodiment of a test pattern, which might be similar to the test pattern in FIG. 1.

Turning briefly to FIG. 2, illustrated is one exemplary embodiment of a test pattern 200, which might be similar to the test pattern 130 in FIG. 1. In the illustrative embodiment of FIG. 2, the test pattern 200 comprises a reoccurring line/space structure. Other test patterns are, however, within the broad scope of the present invention. For example, it is believed that many other patterns, many of which are reflective grating type structures, may also be used.

The test pattern 200 should have certain design parameters such that it works properly for its task at hand. For example, the length (L) of the test pattern 200 should be sufficient so that it can split at least two of the aforementioned step-areas A-X. In an optimal situation, the test pattern 200 would be sufficiently placed such that its length (L) would be rather important. This is not altogether practical, as many times the accurate placement of the test pattern 200 can be tricky.

Therefore, in one embodiment, if the length (L) of the test pattern 200 is longer than the prescribed step-distance of the mask writing device, no situation could exist for the test pattern 200 to not be located within at least two step-areas A-X. For example, the JBX 9000 discussed above has a prescribed step-distance of about 500 µm. If one were using the JBX 9000, then a test pattern length of greater than 500 µm would assure that the test pattern 200 was in at least two step-areas. Accordingly, the minimum test pattern 200 length is often dictated by the writing tool forming the patterned layer.

Similarly, the pitch (P) of the test pattern 200 is of importance. The magnitude of the variance in the CD of the patterned material as designed depends on the pitch (P). It is believed that the pitch (P) of the test pattern 200 is related to the optical wavelength of exposure tool used to pattern the wafer. As a general guideline, the pitch (P) can be (+/−10%):

| Wavelength in exposure tool | Pitch on wafer scale (1X) |
|---|---|
| 363 nm | 0.50 um |
| 248 um | 0.34 um |
| 193 nm | 0.26 um |
| 157 nm | 0.21 um |

In one embodiment the reoccurring line/space structure may have a pitch (P) of less than about 3/2 the wavelength in use. Other pitches (P), however, will also work.

The width (W) of the test pattern 200 is generally not important. In certain embodiments, however, the width (W) should be kept minimal, such that the test pattern can be easily positioned within the aforementioned scribe region. Similarly, the individual line/space structures need not be either completely horizontal or vertical. For example, while the test feature as a whole is preferably either horizontal or vertical, the individual line/space structures could be at an angle, such as a 45 degree angle.

Figure 3:
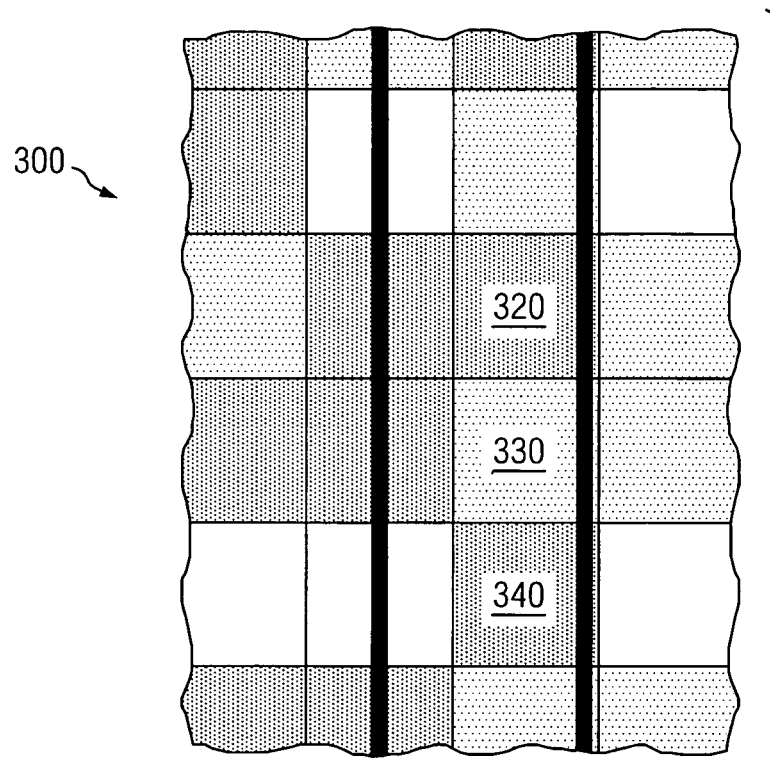
FIG. 3 illustrates two views that might result from using a test feature similar to that disclosed in FIGS. 1 or 2.
Figure 3:
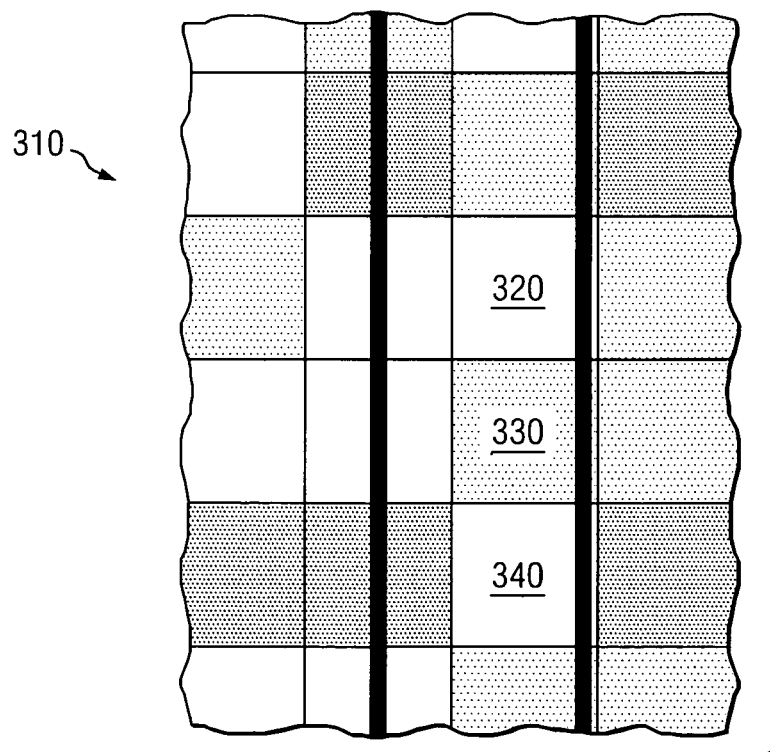

Turning briefly to FIG. 3, illustrated are two views 300, 310 that might result from using a test feature similar to that disclosed above. It should initially be noted that each of the views 300, 310, are of the same layer, however, the focus of the optical microscope is being adjusted to provide the different contrast levels. Notice how the different light and dark regions occur. This is indicative of a variation in the patterned features that resulted from the mask writing device not accurately re-calibrating itself.

Also, notice how the light and dark regions occur in squares. As one would imagine, these squares are representative of the step-area and step-distance of the mask writing tool forming the patterned layer. Because the squares represent the amount of reflected light from the patterned layer, the larger the contrast between two squares, the larger the variance between those squares. As an example, the variance between squares 320 and 330 would be larger than the variance between squares 320 and 340. As indicated above, often the focus on the optical microscope can be adjusted to highlight these differences.

Figure 4:
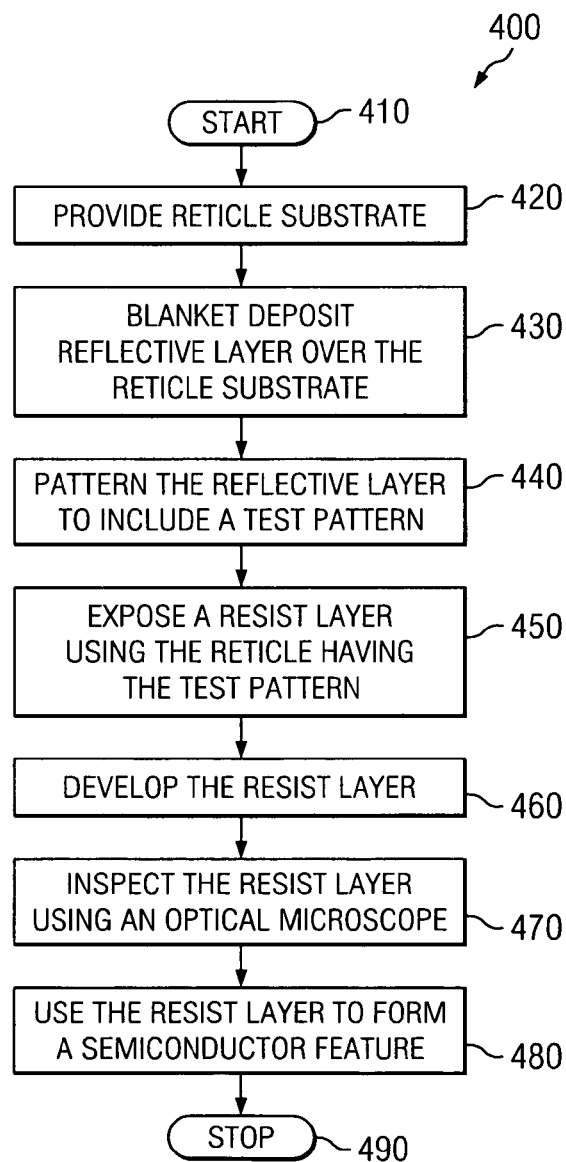
FIG. 4 illustrates a flow chart 400 depicting how one might monitor a CD of a reticle, or if taken a few steps further, make a semiconductor device using the reticle, in accordance with the principles of the present invention.

Turning now to FIG. 4, illustrates is a flow chart 400 depicting how one might monitor a CD of a reticle, or if taken a few steps further, make a semiconductor device using the reticle, in accordance with the principles of the present invention. The flow chart 400 of FIG. 4, begins with a start step 410. In an initial step 420 a reticle substrate is provided. Often a glass wafer acts as the reticle substrate. The material composition of the reticle substrate, however, is inconsequential.

In a step 430, a blanket layer of reflective coating is deposited over the reticle substrate. As indicated above, the blanket layer need not always be a reflective layer, but it may be an energy absorbent layer or other similar layer. Further, the blanket layer may have any known or hereafter discovered thickness.

Subsequent to step 430, and in a step 440, the reflective layer is patterned. As can be envisioned, the reflective layer may be patterned to include actual circuit patterns as well as at least one of the test patterns. The location of the actual circuit patterns and test patterns may vary. Certain embodiments of some acceptable locations of the test pattern were disclosed above with respect to FIG. 1. Once again, at least a portion of the test pattern should be located within a step-distance of a portion of the patterned layer. Other small processes may be conducted on the reticle substrate or patterned layer. Nonetheless, at this point the reticle is ready to pattern a resist layer.

Thus, in a step 450, the reticle may be used to expose a resist layer. The resist exposure step, which is conventional, causes the pattern in the reticle to transfer to the resist material. This pattern, as one would expect, also includes the test pattern. Those skilled in the art understand the reduction in scale between the reticle, and more specifically the patterned reticle features, and the resist layer, and more specifically the patterned resist features. Often the reduction is four fold (4×), however, reductions ranging from two fold (2×) to six fold (6×), as well as others, exist.

After step 450, and in a step 460, the resist layer is conventionally developed. As those skilled in the art are well aware, the developing causes the areas not exposed, or vice-versa, to be removed. What results, is a pattern on the resist layer similar to the pattern in the reticle. This resist pattern, therefore, includes the test pattern.

In an important step 470, the patterned resist layer is visually inspected using an optical inspection tool. The optical inspection tool, in one embodiment, is an optical microscope. By visually inspecting the patterned resist layer, and particularly the test pattern that is located in at least two step-areas, one can look for the light and dark regions. If the variance is big enough, the light and dark regions could be observed by microscope inspection on the reticle itself. If the light and dark regions are not observed, then it may be assumed that there is substantially no variance across the test feature. Accordingly, if substantially no variance across the test feature exists, it can be assumed that there is substantially no variance across the patterned features located in the same step-areas as the test feature.

If, however, light and dark regions are observed, then one can assume that there is a variance across the test feature. Accordingly, it can be assumed that a similar variance would exist across the patterned features located in the same step-areas as the test feature producing the light and dark regions. At this point, the manufacturing process would most likely stop for a moment as the severity of the variance is attained. If it was deemed that the severity was unacceptable, the process would quit and a solution would be decided upon. If, however, it was deemed that the severity was acceptable, the process would resume.

Therefore, in a step 480, the resist layer would be used to form a semiconductor feature or features. In a subsequent step not depicted, the feature or features could be electrically contacted, thereby providing an operational integrated circuit. After completing step 480, the process could stop in a step 490.

The present invention, therefore, provides a number of benefits not currently available in the art. For example, the present invention provides a novel method for monitoring CD variations in a reticle not previously available in the prior art. The method, and the reticle used to implement the method, have been proven effective. Additionally, the test pattern is easy to implement into many company's existing production reticles, and often at no additional cost. Further, variations in the CDs are generally easy to inspect with a focus exposure matrix test.

Although the present invention has been described in detail, those skilled in the art should understand that they can make various changes, substitutions and alterations herein without departing from the spirit and scope of the invention in its broadest form.

What is claimed is:

1. A method for monitoring critical dimension (CD) variations of a reticle, comprising:
    providing a reticle layer over a reticle substrate, said reticle layer including each of:
        a patterned feature area corresponding to a desired circuitry pattern; and
        a test pattern area, wherein a portion of said test pattern area is within a step-distance of a portion of said patterned feature area;
    patterning a resist material by stepping said reticle, the patterning including each of the patterned feature area and test pattern area incorporated in said reticle layer;
    visually inspecting said resist material for light and dark regions within said test pattern area, said light and dark regions representing a corresponding variance in said patterned feature area of the resist material,
    using said resist material as patterned by said reticle to form the feature of a semiconductor device after said visually inspecting.

2. The method as recited in claim 1 wherein said portion of said test pattern area is a first portion of said test pattern area and said portion of said patterned feature area is a first portion of said patterned area and wherein said first portion of said test pattern area is within a step-distance of said first portion of said patterned feature area and a second portion of said test pattern area is within a step-distance of a second portion of said patterned feature area, a variance between said first and second portions of said test pattern area being indicative of a variance between said first and second portions of said patterned feature area.

3. The method as recited in claim 1 wherein said test pattern area creates a reflective grating in said patterned resist material, and said reflective grating is configured to provide said light and dark regions if said variance in said patterned feature area exists.

4. The method as recited in claim 3 wherein said reflective grating includes a reoccurring line/space structure.

5. The method as recited in claim 4 wherein said reoccurring line/space structure has a pitch of less than about 3/2 a wavelength used in said patterning step.

6. The method as recited in claim 1 wherein said test pattern area is located in a scribe region defined by said patterned feature area.

7. The method as recited in claim 1 wherein said variance is a systematic variance in critical dimension (CD) in said patterned feature area.

8. The method as recited in claim 1 wherein visually inspecting said material includes visually inspecting said material using an optical microscope.

9. The method as recited in claim 8, further including changing a focus on said optical microscope to cause said light and dark regions to become more or less pronounced.

10. A method for making a semiconductor device, comprising:
    patterning a resist material by stepping a reticle, wherein said reticle includes each of:
        a patterned feature area corresponding to a desired feature of a semiconductor device; and
        a test pattern area, wherein a portion of said test pattern area is within a step-distance of a portion of said patterned feature area; and
    visually inspecting said patterned resist material for light and dark regions within a corresponding test pattern area, said light and dark regions representing a systematic variance in critical dimension (CD) in said patterned resist material;
    using said patterned resist material to form the feature of a semiconductor device after said visually inspecting.

11. The method as recited in claim 10 wherein said patterned resist material is used to form multiple features, and wherein said multiple features are electrically contacted to form an operational integrated circuit.

12. A method for making a semiconductor device, comprising:
    patterning a resist material using a reticle having a plurality of step areas within the reticle, wherein said reticle includes each of:
        a patterned feature area corresponding to a desired feature of a semiconductor device; and
        a test pattern area, wherein a portion of said test pattern area is within a step-area distance of a portion of said patterned feature area; and
    visually inspecting said patterned resist material for light and dark regions, differences in said light and dark regions between said plurality of step areas representing a systematic variance in critical dimension (CD) in said patterned resist material;
    using said patterned resist material to form the feature of a semiconductor device after said visually inspecting.

* * * * *